US008993894B2

(12) United States Patent
Kawai et al.

(10) Patent No.: US 8,993,894 B2
(45) Date of Patent: Mar. 31, 2015

(54) PRINTED WIRING BOARD AND METHOD FOR MANUFACTURING THE SAME

(75) Inventors: Hideyuki Kawai, Ogaki (JP); Yoshinori Takenaka, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 191 days.

(21) Appl. No.: 13/424,491

(22) Filed: Mar. 20, 2012

(65) Prior Publication Data
US 2012/0250281 A1 Oct. 4, 2012

Related U.S. Application Data

(60) Provisional application No. 61/469,258, filed on Mar. 30, 2011.

(51) Int. Cl.
*H05K 1/03* (2006.01)
*H05K 3/42* (2006.01)
(Continued)

(52) U.S. Cl.
CPC .............. *H05K 3/427* (2013.01); *H05K 3/3478* (2013.01); *H05K 3/4661* (2013.01); *H05K 2201/0209* (2013.01); *H05K 2201/0959* (2013.01); *H05K 2203/041* (2013.01)
USPC .......................................... 174/255; 174/251

(58) Field of Classification Search
CPC ... H05K 1/0203; H05K 1/0254; H05K 1/111; H05K 1/112; H05K 3/429; H05K 2201/096; H05K 3/4602; H05K 1/115; G06F 2200/201; H01L 2924/01079; H01L 2924/01078; H01L 2224/16; H01L 2924/01029; H01L 4/15311
USPC .......... 174/260–266, 255, 251; 257/774–775; 361/760, 792–795
See application file for complete search history.

(56) References Cited

U.S. PATENT DOCUMENTS 7,183,497 B2 * 2/2007 Kojima et al. ................. 174/262
2004/0238209 A1 * 12/2004 Yuri et al. ..................... 174/257
(Continued)

FOREIGN PATENT DOCUMENTS

JP 2001-144434 5/2001
JP 2001-168490 6/2001
(Continued)

OTHER PUBLICATIONS

JP 2001-168531 English Translation.*
(Continued)

*Primary Examiner* — Yuriy Semenenko
*Assistant Examiner* — Pete Lee
(74) *Attorney, Agent, or Firm* — Oblon, McClelland, Maier & Neustadt, L.L.P.

(57) ABSTRACT

A printed wiring board includes a core substrate having first and second surfaces, a first conductor formed on the first surface of the substrate, a second conductor formed on the second surface of the substrate, a first through-hole conductor formed through the substrate and connecting the first and second conductors, and a second through-hole conductor formed through the substrate and connecting the first and second conductors. The second through-hole conductor has a diameter which is greater than a diameter of the first through-hole conductor, the first through-hole conductor has a roughened inner wall forming an interior space, the second through-hole conductor has a roughened inner wall forming an interior space, and the roughened inner wall of the first through-hole conductor has an arithmetic average roughness which is set lower than an arithmetic average roughness of the roughened inner wall of the second through-hole conductor.

12 Claims, 7 Drawing Sheets

(51) Int. Cl.
*H05K 3/34* (2006.01)
*H05K 3/46* (2006.01)

(56) References Cited

U.S. PATENT DOCUMENTS

2008/0055872 A1* 3/2008 Inagaki et al. ................ 361/760
2009/0039486 A1* 2/2009 Shimazaki et al. ........... 257/676
2011/0297426 A1* 12/2011 Sunohara et al. ............. 174/251

FOREIGN PATENT DOCUMENTS

JP 2001-168531 6/2001
JP 2005-347391 12/2005
JP 2006-120729 5/2006

OTHER PUBLICATIONS

JP 2001-168489 English Translation.*

* cited by examiner (a)

(b)

(c)

(d)

(e)

(j)

(k)

(l)

(m)

(n)

(o)

(p)

(q)

PRINTED WIRING BOARD AND METHOD FOR MANUFACTURING THE SAME

CROSS-REFERENCE TO RELATED APPLICATIONS

The present application is based on and claims the benefit of priority to U.S. Application No. 61/469,258, filed Mar. 30, 2011, the entire contents of which are incorporated herein by reference.

BACKGROUND OF THE INVENTION

1. Field of the Invention

The present invention relates to a printed wiring board and its manufacturing method.

2. Discussion of the Background

Multilayer buildup wiring boards are widely used as package substrates. Such a multilayer buildup wiring board is formed by building up an interlayer resin insulation layer with wiring one layer at a time on a core substrate where through holes are formed to be a signal line, a power-source line or a ground line. In an IC chip where high-frequency signals are transmitted, unless high-frequency properties are enhanced and impedance is lowered in the power-source line and ground line to be distributed to the package substrate, power supply through the power-source line falls behind and the earth potential level through the ground line may fluctuate to cause malfunctioning. In a package substrate to respond to high frequencies, frequency properties are improved by arranging multiple ground lines and power-source lines so as to achieve the same effects as with inductance in a parallel connection.

To connect wiring lines formed on both surfaces of a core substrate, a through hole is formed by using a drill to bore a penetrating hole in the core substrate or by using a laser to bore a penetrating hole, and then by forming a conductive layer inside. When through holes are formed, through holes with different diameters are formed by selecting the size of a drill or by properly selecting a drill or a laser (see Japanese Laid-Open Patent Publication 2001-168531). The entire contents of this publication are incorporated herein by reference.

SUMMARY OF THE INVENTION

According to one aspect of the present invention, a printed wiring board includes a core substrate having a first surface and a second surface on the opposite side of the first surface of the core substrate, a first conductor formed on the first surface of the core substrate, a second conductor formed on the second surface of the core substrate, a first through-hole conductor formed through the core substrate and connecting the first conductor and the second conductor, and a second through-hole conductor formed through the core substrate and connecting the first conductor and the second conductor. The second through-hole conductor has a diameter which is greater than a diameter of the first through-hole conductor, the first through-hole conductor has a roughened inner wall forming an interior space, the second through-hole conductor has a roughened inner wall forming an interior space, and the roughened inner wall of the first through-hole conductor has an arithmetic average roughness which is set lower than an arithmetic average roughness of the roughened inner wall of the second through-hole conductor.

According to another aspect of the present invention, a method for manufacturing a printed wiring board includes forming a first conductor on a first surface of a core substrate, forming a second conductor on a second surface of the core substrate on the opposite side of the first surface of the core substrate, forming a first through-hole conductor through the core substrate such that the first conductor and the second conductor are connected by the first through-hole conductor and the first through-hole conductor has a roughened inner wall and an interior space formed by the roughened inner wall of the first through-hole conductor, and forming a second through-hole conductor through the core substrate such that the first conductor and the second conductor are connected by the second through-hole conductor and the second through-hole conductor has a roughened inner wall and an interior space formed by the roughened inner wall of the second through-hole conductor. The second through-hole conductor has a diameter which is greater than a diameter of the first through-hole conductor, the roughened inner wall of the first through-hole conductor is formed such that the roughened inner wall of the first through-hole conductor is set to have an arithmetic average roughness Ra1, the roughened inner wall of the second through-hole conductor is formed such that the roughened inner wall of the second through-hole conductor is set to have an arithmetic average roughness Ra2, and the arithmetic average roughness Ra1 of the roughened inner wall of the first through-hole conductor is set lower than the arithmetic average roughness Ra2 of the roughened inner wall of the second through-hole conductor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
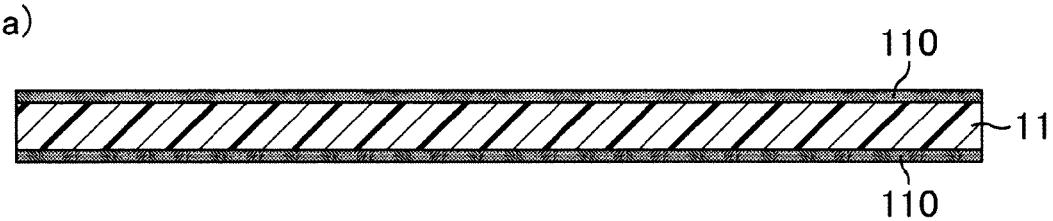
FIGS. 1(a)~(e) are cross-sectional views schematically showing each step in a method for manufacturing a printed wiring board according to a first embodiment of the present invention.
Figure 1:
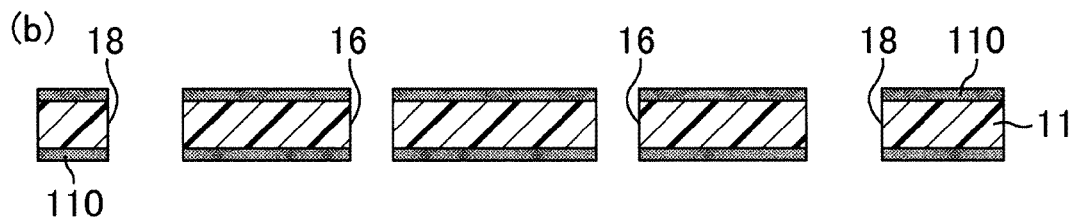
Figure 1:
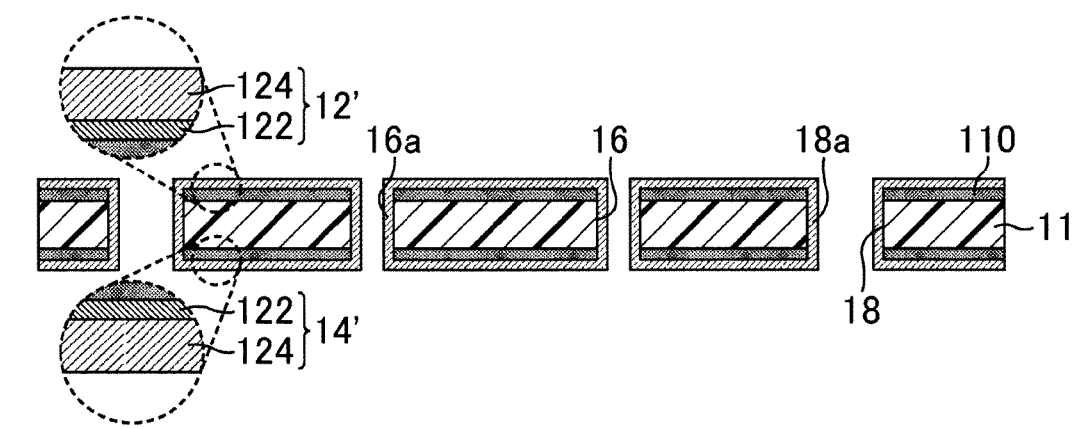
Figure 1:
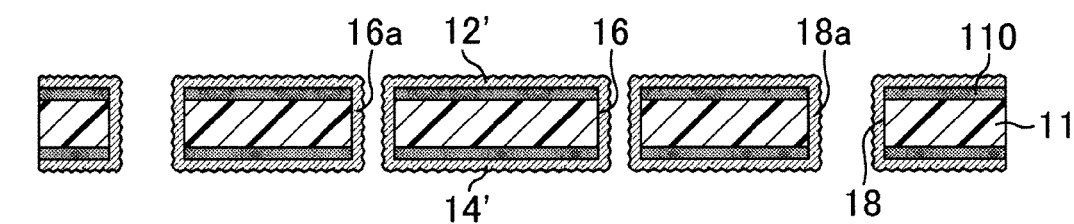
Figure 1:
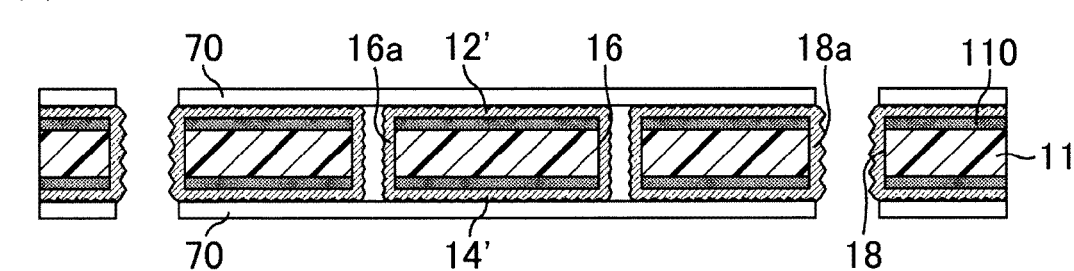

The embodiments will now be described with reference to the accompanying drawings, wherein like reference numerals designate corresponding or identical elements throughout the various drawings.

First Embodiment

A printed wiring board and its manufacturing method are described here.

Figure 6:
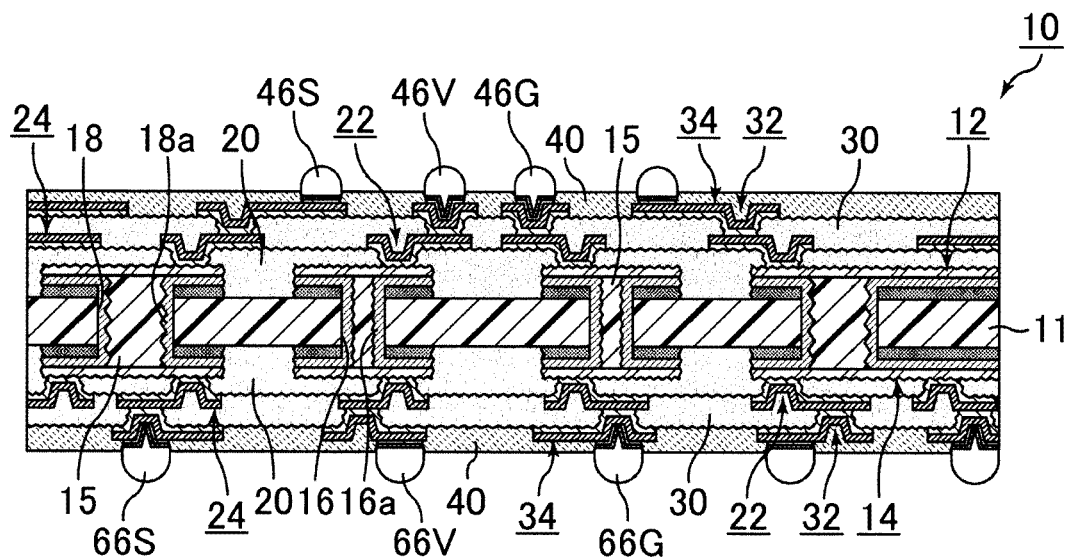
FIG. 6 is a cross-sectional view schematically showing a printed wiring board obtained by the method for manufacturing a printed wiring board according to the first embodiment.
Figure 7:
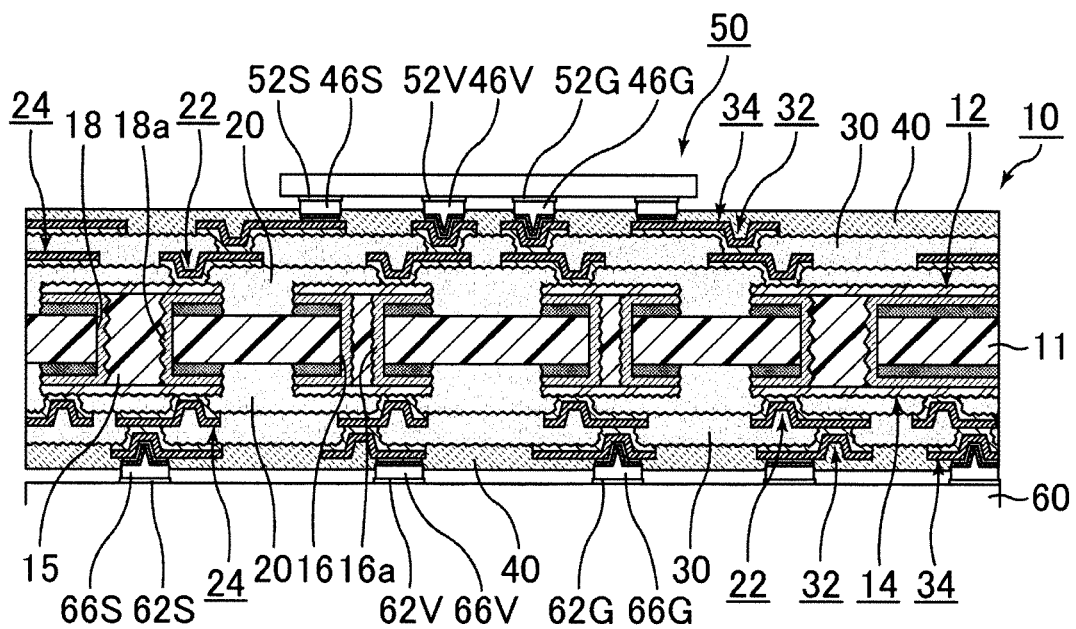
FIG. 7 is a cross-sectional view schematically showing a printed wiring board of the first embodiment where an IC chip is mounted.

FIG. 7 is a cross-sectional view schematically showing a state in which an IC chip is mounted on a printed wiring board of a first embodiment. In printed wiring board 10 of the first embodiment shown in FIG. 6, first conductive circuit 12 made of a first conductor is formed on an upper surface of core substrate 11 (hereinafter referred to as a first surface), and second conductive circuit 14 made of a second conductor is formed on a lower surface of core substrate 11 (hereinafter referred to as a second surface).

First penetrating hole 16 is formed in the central part of core substrate 11, and second penetrating hole 18 having a larger diameter than first penetrating hole 16 is formed in the peripheral part. First through-hole conductor (16a) is formed in first penetrating hole 16 so as to connect first conductive circuit 12 made of the first conductor and second conductive circuit 14 made of the second conductor. Also, second through-hole conductor (18a) is formed in second penetrating hole 18 so as to connect first conductive circuit 12 and second conductive circuit 14. Then, arithmetic average roughness (Ra1) on the inner wall of first through-hole conductor (16a) formed in first penetrating hole 16 is set lower than arithmetic average roughness (Ra2) on the inner wall of second through-hole conductor (18a) formed in second penetrating hole 18.

In addition, filling material 15 containing resin and inorganic filler is formed in first penetrating hole 16 and second penetrating hole 18.

Meanwhile, lower interlayer resin insulation layer 20 is formed on first conductive circuit 12 and on the first surface of core substrate 11. Conductive circuit 24 is formed on lower interlayer resin insulation layer 20. Conductive circuit 24 and first conductive circuit 12 are connected by via conductor 22 in lower interlayer resin insulation layer 20. Interlayer resin insulation layer 30 is formed on lower interlayer resin insulation layer 20 and on conductive circuit 24. Conductive circuit 34 is formed on interlayer resin insulation layer 30. Conductive circuit 34 and conductive circuit 24 are connected by via conductor 32 in lower interlayer resin insulation layer 30. Solder-resist layer 40 having openings is positioned on lower interlayer resin insulation layer 30 and conductive circuit 34.

On the other hand, lower interlayer resin insulation layer 20 is formed on second conductive circuit 14 and on the second surface of core substrate 11. Conductive circuit 24 is formed on lower interlayer resin insulation layer 20. Conductive circuit 24 and second conductive circuit 14 are connected by via conductor 22 in lower interlayer resin insulation layer 20. Interlayer resin insulation layer 30 is formed on lower interlayer resin insulation layer 20 and on conductive circuit 24. Conductive circuit 34 is formed on interlayer resin insulation layer 30. Conductive circuit 34 and conductive circuit 24 are connected by via conductor 32 in lower interlayer resin insulation layer 30. Solder-resist layer 40 having openings is positioned on lower interlayer resin insulation layer 30 and conductive circuit 34.

In openings of solder-resist layer 40 on the upper surface of printed wiring board 10, solder bumps (46S, 46V, 46G) are formed for connection with an IC chip, which is a semiconductor element. Meanwhile, in the openings of solder-resist layer 40 on the bottom surface of printed wiring board 10, solder bumps (66S, 66V, 66G) are formed for connection with a motherboard.

Signal pad (52S), power-source pad (52V) and ground pad (52G) are arranged on IC chip 50. Signal pad (52S) is connected through solder bump (46S) and via conductors (32, 22) to second penetrating hole 18 (second through-hole conductor 18a) with a larger diameter positioned in the peripheral part of core substrate 11.

On the other hand, power-source pad (52V) of IC chip 50 is connected through solder bump (46V) and upper-surface side via conductors (22, 32) to first through-hole conductor (16a) positioned in the central part of core substrate 11. Then, connection is made from first through-hole conductor (16a) to power-source pad (62V) of motherboard 60 through lower-surface side via conductors (22, 32) and bump (66V).

In the same manner, ground pad (52G) of IC chip 50 is connected through solder bump (46G) and upper-surface side via conductors (22, 32) to first through-hole conductor (16a) positioned in the central part of core substrate 11. Then, connection is made from first through-hole conductor (16a) to ground pad (62G) of motherboard 60 through lower-surface side via conductors (22, 32) and solder bump (66G).

In printed wiring board 10 according to the first embodiment, first through-hole conductor (16a) with a smaller diameter is formed directly under IC chip 50 which is a semiconductor element, and second through-hole conductor (18a) with a larger diameter is formed in the peripheral part, as shown in FIG. 7.

In the printed wiring board according to the first embodiment, by setting first through-hole conductor (16a) with a smaller diameter to be positioned directly under IC chip 50 as a power-source line or a ground line, multiple power-source lines and ground lines are arranged, while the wiring length is reduced from IC chip 50 to motherboard 60. Accordingly, inductance is reduced in the power-source lines and ground lines to the IC chip, and power is supplied instantaneously without causing loss, thereby preventing malfunctioning of the IC chip.

Next, first penetrating hole 16 (first through-hole conductor 16a) and second penetrating hole 18 (second through-hole conductor 18a) formed in core substrate 11 are described.

First penetrating hole 16 and second penetrating hole 18 are formed by a laser or a drill. However, it is preferred to use a drill to form both first penetrating hole 16 and second penetrating hole 18, because a penetrating hole with a predetermined diameter is securely formed.

In a printed wiring board according to the first embodiment, the diameter of first penetrating hole 16 is preferred to be 180 μm or smaller, more preferably 150 μm or smaller. By setting so, the number of through-hole conductors to function as power-source lines and ground lines increases, resulting in a decrease of mutual inductance. In addition, the diameter of second penetrating hole 18 is preferred to be approximately 200 μm or greater. By setting so, electrical resistance is reduced in through-hole conductors to function as signal lines.

Arithmetic average roughness (Ra1) on the inner wall of first through-hole conductor (16a) formed in first penetrating hole 16 is preferred to be lower than arithmetic average roughness (Ra2) on the inner wall of second through-hole conductor (18a) formed in second penetrating hole 18; preferably 0.2 μm or lower, more preferably 0.1 μm or greater and 0.2 μm or lower. Arithmetic average roughness (Ra2) on the inner wall of second through-hole conductor (18a) formed in second penetrating hole 18 is preferred to exceed 0.2 μm and be 0.3 μm or lower. Here, arithmetic average roughness (Ra) is a value determined according to JIS B 0601-1994 and indicates an average value of absolute values of deviations from the average line.

In printed wiring board 10 according to the first embodiment, filling material containing resin and inorganic filler is filled in first penetrating hole 16 and second penetrating hole 18.

The above resin is not limited to any specific type, and cycloolefin resins, epoxy resins and the like are listed. Such resins may be used independently, or two or more types may be combined.

In addition, the above inorganic filler is not limited to any specific type; for example, aluminum compounds, calcium compounds, potassium compounds, magnesium compounds, silicon compounds and the like are listed. Those compounds may be used independently, or two or more types may be combined.

As for the above aluminum compounds, for example, alumina, aluminum hydroxide and the like are listed. As for the above calcium compounds, for example, calcium carbonate, calcium hydroxide and the like are listed. As for the above potassium compounds, for example, potassium carbonate and the like are listed. As for the above magnesium compounds, for example, magnesium oxide, dolomite, basic magnesium carbonate and the like are listed. As for the above silicon compounds, for example, silica, zeolite and the like are listed.

The shape of the above inorganic filler is not limited to any specific shape; for example, spheres, elliptical spheres, polyhedrons and the like are listed. The size of the above inorganic filler is preferred to have a maximum length (or diameter) in the range of 0.1~5.0 μm. If the length is less than 0.1 μm, it is difficult to mitigate the inner stress generated when filling material layer 15 is thermally expanded, and its thermal expansion coefficient will not be adjusted. If the length exceeds 5.0 μm, the mechanical characteristics of filling material layer 15 will deteriorate.

When combining the above inorganic filler, the amount is preferred to be in the range of 3~50 weight percent. If the amount is less than 3 wt. %, the thermal expansion coefficient of filling material layer 15 may not decrease sufficiently. On the other hand, if the amount exceeds 50 wt. %, the viscosity of the filling material increases, resulting in a difficulty in filling. The more preferable amount to combine is 5~40 weight percent.

The following describes a method for manufacturing a printed wiring board according to the first embodiment of the present invention. FIGS. 1(a)~(e), FIGS. 2(f)~(i), FIGS. 3(j)~(m), FIGS. 4(n)~(q), FIGS. 5(r)~(s) and FIG. 6 are cross-sectional views schematically showing a method for manufacturing a printed wiring board according to the first embodiment of the present invention.

(1) First, as shown in FIG. 1(a), core substrate 11 is prepared. The core substrate is not limited to a specific type. For example, resin substrates such as a glass-epoxy substrate, a bismaleimide-triazine (BT) resin substrate, a copper-clad laminate and an RCC substrate, ceramic substrates such as an aluminum nitride substrate, silicon substrates or the like are listed. FIG. 1(a) shows a copper-clad laminate having copper foils 110.

(2) Next, a drill is used to bore first penetrating hole 16 with a diameter of 150 μm, for example, in the central part of core substrate 11. Then, using a drill with a larger diameter than that used for forming first penetrating hole 16, second penetrating hole 18 with a diameter of 250 μm, for example, is formed in the peripheral part of core substrate 11 (see FIG. 1(b)). First penetrating hole 16 with a smaller diameter may be formed by a laser, but a penetrating hole with a predetermined diameter is securely formed by using a drill.

(3) Next, core substrate 11 is immersed in an electroless plating solution to form electroless plated film 122 on surfaces of the core substrate and on the inner walls of first penetrating hole 16 and second penetrating hole 18. Then, core substrate 11 is immersed in an electrolytic plating solution to form electrolytic plated film 124 on surfaces of the core substrate and on the inner walls of first penetrating hole 16 and second penetrating hole 18.

Through the above procedures, a layer of first conductor (12') is formed on the first surface of core substrate 11, and a layer of second conductor (14') is formed on the second surface of core substrate 11. Also, first through-hole conductor (16a) is formed in first penetrating hole 16 and second through-hole conductor (18a) is formed (see FIG. 1(c)).

(4) Next, after the above treatment (3), core substrate 11 is immersed in a blackening bath (oxidation bath) for a black-oxide roughening treatment, and surfaces of the first conductive layer, second conductive layer, first through-hole conductor (16a) and second through-hole conductor (18a) are roughened (see FIG. 1(d)). Here, roughened surfaces are formed by black-oxide and reduction treatments. However, later-described etching or electroless plating may also be employed for forming roughened surfaces.

(5) Next, photosensitive film for forming plating resist 70 is laminated on both surfaces of core substrate 11, and pattern etching is performed to make an opening so that only a portion corresponding to second penetrating hole 18 with a larger diameter is exposed.

(6) Next, core substrate 11 is immersed in a blackening bath (oxidation bath) again for a black-oxide roughening treatment. Accordingly, only second through-hole conductor (18a) exposed to the outside receives a roughening treatment twice. Through the above roughening treatment, arithmetic average roughness (Ra2) on the inner wall of second penetrating hole 18 (surface of second through-hole conductor 18a) becomes greater than arithmetic average roughness (Ra1) on the inner wall of first penetrating hole 16 (surface of first through-hole conductor 16a) (see FIG. 1(e)). Preferred values of arithmetic average roughness (Ra1) on the inner wall of a first penetrating hole (surface of first through-hole conductor 16a) and arithmetic average roughness (Ra2) on the inner wall of a second penetrating hole (surface of second through-hole conductor 18a) were described in the section on a printed wiring board according to the first embodiment. Therefore, the description is omitted here.

(7) Next, filling material containing epoxy resin and inorganic filler is applied on both surfaces of core substrate 11 using a printer. Such printing is preferred to be performed by a vacuum printing method in a reduced-pressure atmosphere or in a vacuum atmosphere. Filling material is filled in first penetrating hole 16 and second penetrating hole 18 by vacuum printing, and heated and dried. Namely, filling material layer 15 is formed in first penetrating hole 16 and second penetrating hole 18 in that step (see FIG. 2(f)). The filling material is preferred to contain a leveling agent or the like in addition to the above resin and inorganic filler. At that time, the printing speed is preferred to be set at 20 mm/second or faster. By printing at such a speed, the filling material is sufficiently filled in first penetrating hole 16 and second penetrating hole 18 without reducing manufacturing efficiency. By using the above filling material and setting the printing speed at 20 mm/second or faster, the filling material is filled simultaneously in first penetrating hole 16 and second penetrating hole 18 by printing once.

Figure 2:
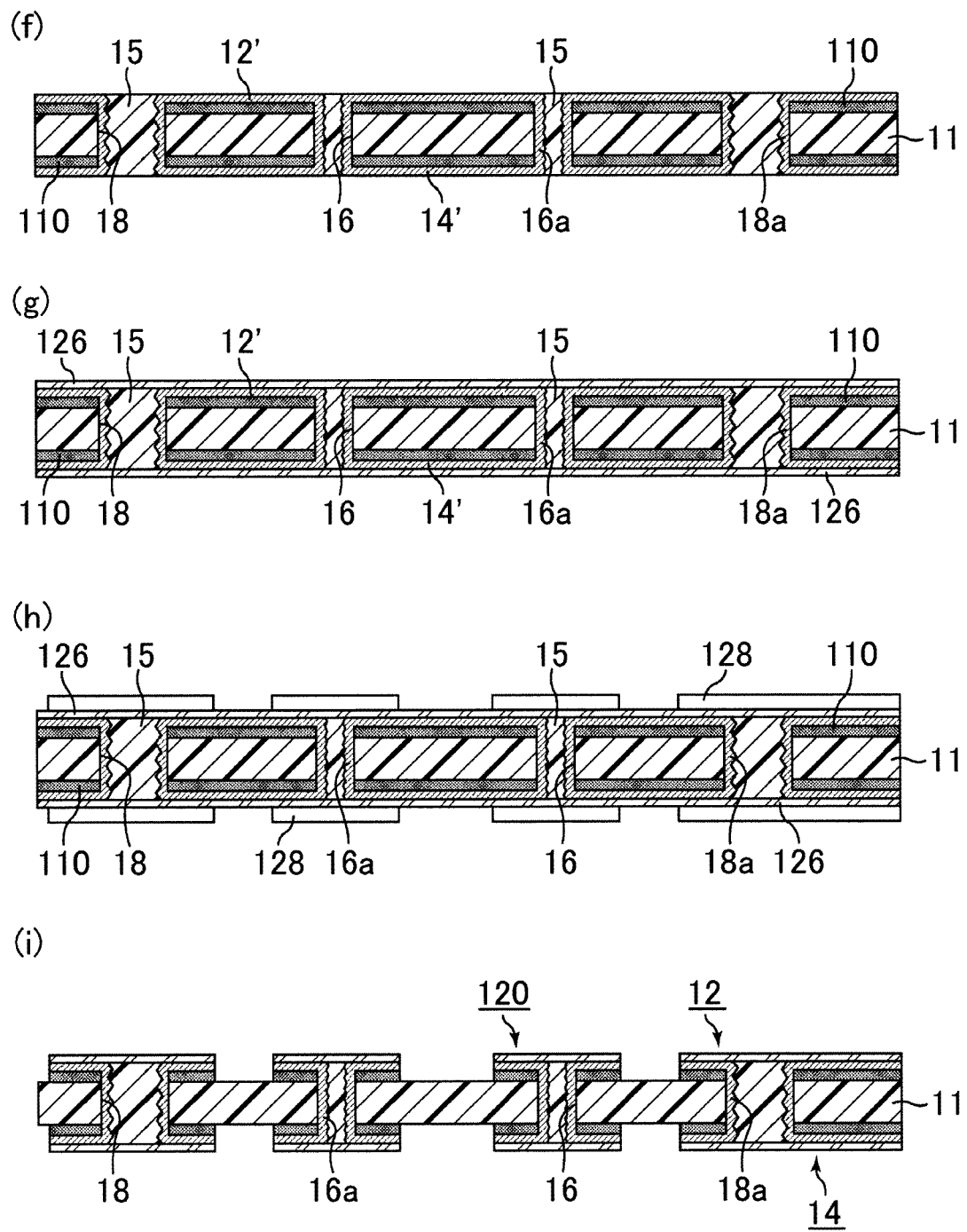
FIGS. 2(f)~(i) are cross-sectional views schematically showing each step in the method for manufacturing a printed wiring board according to the first embodiment of the present invention.

(8) Furthermore, electroless plating and electrolytic plating are performed to form plated films 126 on core substrate 11 (see FIG. 2(g)).

(9) Then, etching resist is formed on plated films 126 on both surfaces (see FIG. 2(h)), and etching is conducted to form patterns of first conductive circuit 12 and second conductive circuit 14 on both surfaces of the substrate (see FIG. 2(i)). By such an etching treatment, plated cover layer 120 is shaped to be a land.

(10) Next, core substrate 11 having first conductive circuit 12 and second conductive circuit 14 is washed with water and dried. Then, an etching solution is sprayed on both surfaces of core substrate 11 to etch surfaces of first conductive circuit 12 and second conductive circuit 14, and surfaces of plated cover layers 120 for first penetrating hole 16 and second penetrating hole 18. Accordingly, surfaces of first conductive circuit 12 and second conductive circuit 14, and surfaces of plated cover layers 120 for first penetrating hole 16 and second penetrating hole 18 are roughened. The above treatment may be performed by immersing in or spraying an etching solution containing copper (II) complex and organic salt or hydrogen peroxide and sulfuric acid.

Figure 3:
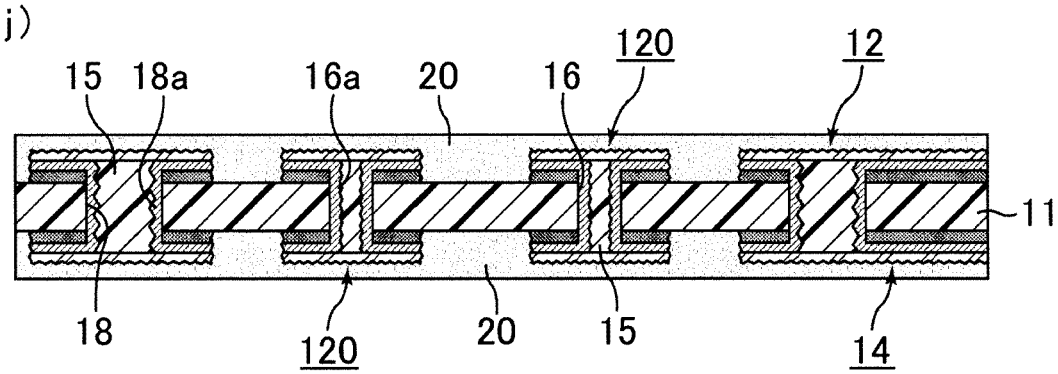
FIGS. 3(j)~(m) are cross-sectional views schematically showing each step in the method for manufacturing a printed wiring board according to the first embodiment of the present invention.
Figure 3:
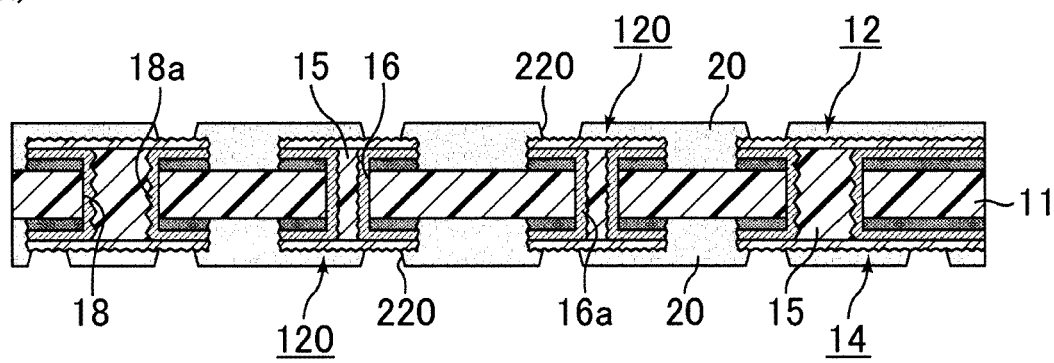
Figure 3:
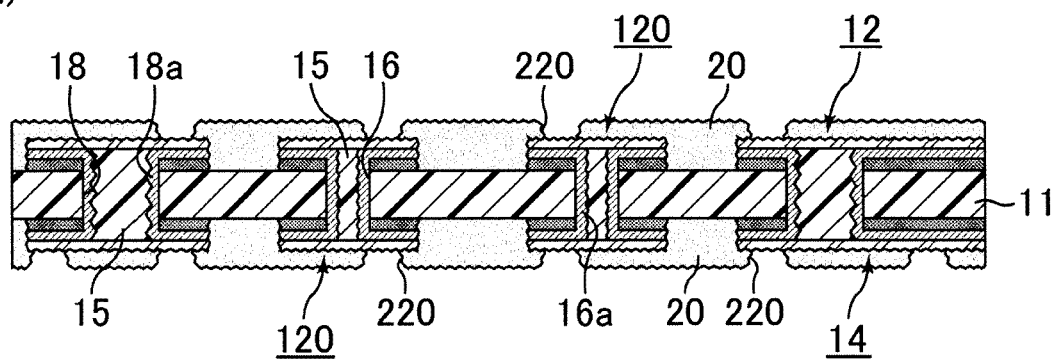
Figure 3:
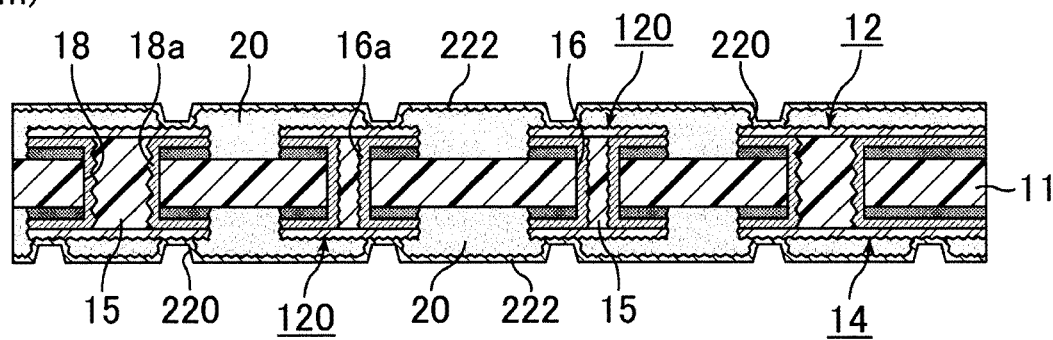

(11) Next, on both surfaces of core substrate 11 after the above procedure, a thermosetting resin sheet is pressure-laminated in a vacuum atmosphere while the temperature is increased from 50 to 150° C. to form lower interlayer resin insulation layers 20 (see FIG. 3(j)).

(12) Next, a carbon-dioxide gas laser is used to form via-conductor openings 220 in lower interlayer resin insulation layers 20 (see FIG. 3(k)). After via-conductor openings 220 are formed, a desmearing treatment is preferred.

(13) Next, surfaces of lower interlayer resin insulation layers 20 are roughened using a permanganic acid solution (see FIG. 3(k)). After that, electroless plating is performed to form electroless plated film 222, for example, on surfaces of lower interlayer resin insulation layers 20 (see FIG. 3(m)).

Figure 4:
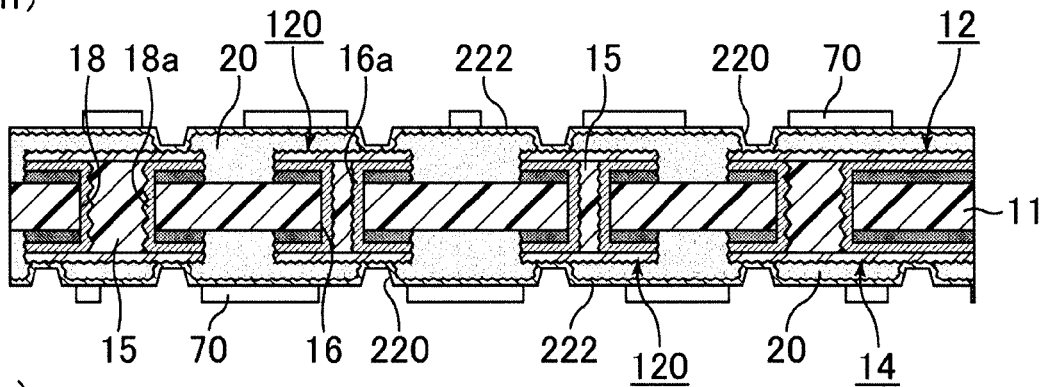
FIGS. 4(n)~(q) are cross-sectional views schematically showing each step in the method for manufacturing a printed wiring board according to the first embodiment of the present invention.
Figure 4:
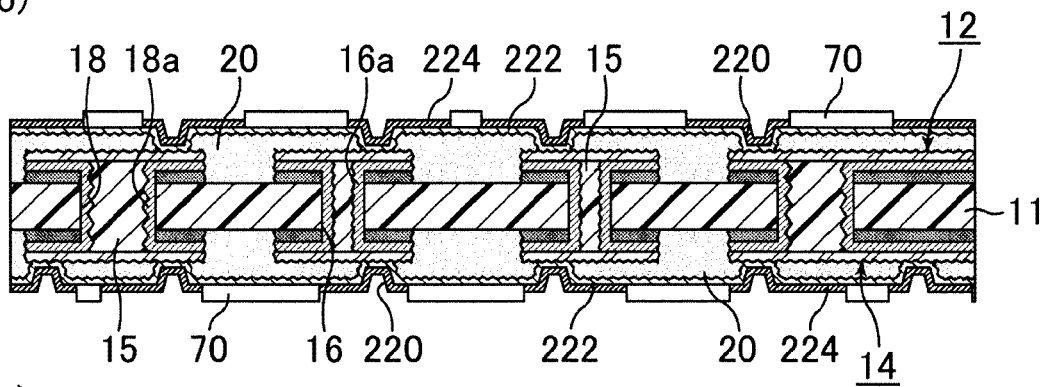
Figure 4:
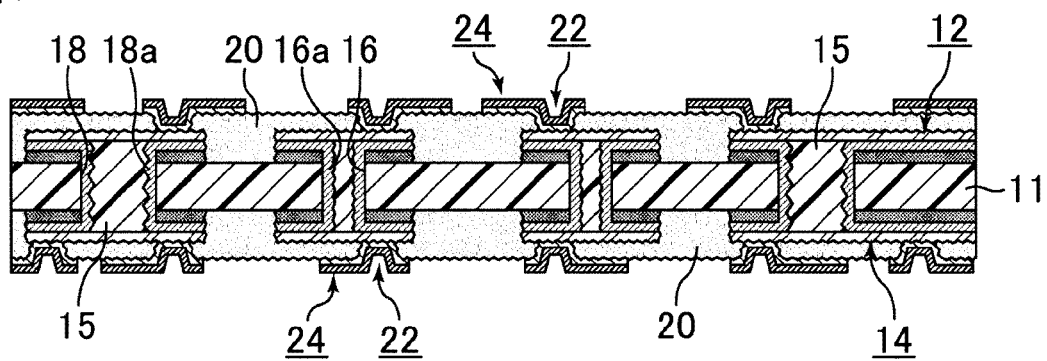
Figure 4:
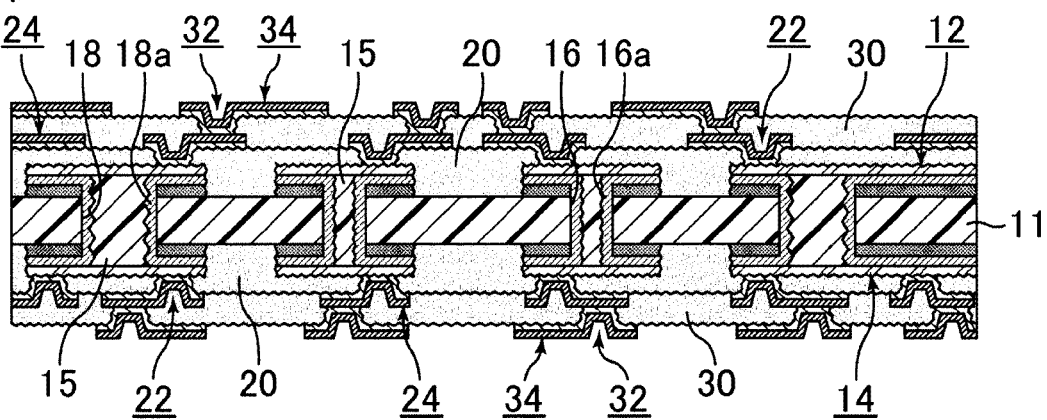

(14) After the above treatment, plating resists 70 on both surfaces of the substrate are patterned (see FIG. 4(n)), and electrolytic plating is performed to form electrolytic plated film 224 (see FIG. 4(o)). A portion to become conductive circuit 24 in a later-described step is thickened and a portion to become via conductor 22 is filled with plating and so on by electrolytic plated film 224.

(15) Then, plating resist 220 is removed and electroless plated film 222 which existed under plating resist 220 is dissolved and removed by etching. Accordingly, conductive circuits 24 (including via conductors 22) made of electroplated copper film 224 and the like are formed (see FIG. 4(p)).

(16) Then, by repeating above steps (9)~(15), further upper interlayer resin insulation layers 30 and conductive circuits 34 (including via conductors 32) are formed (see FIG. 4(q)).

Figure 5:
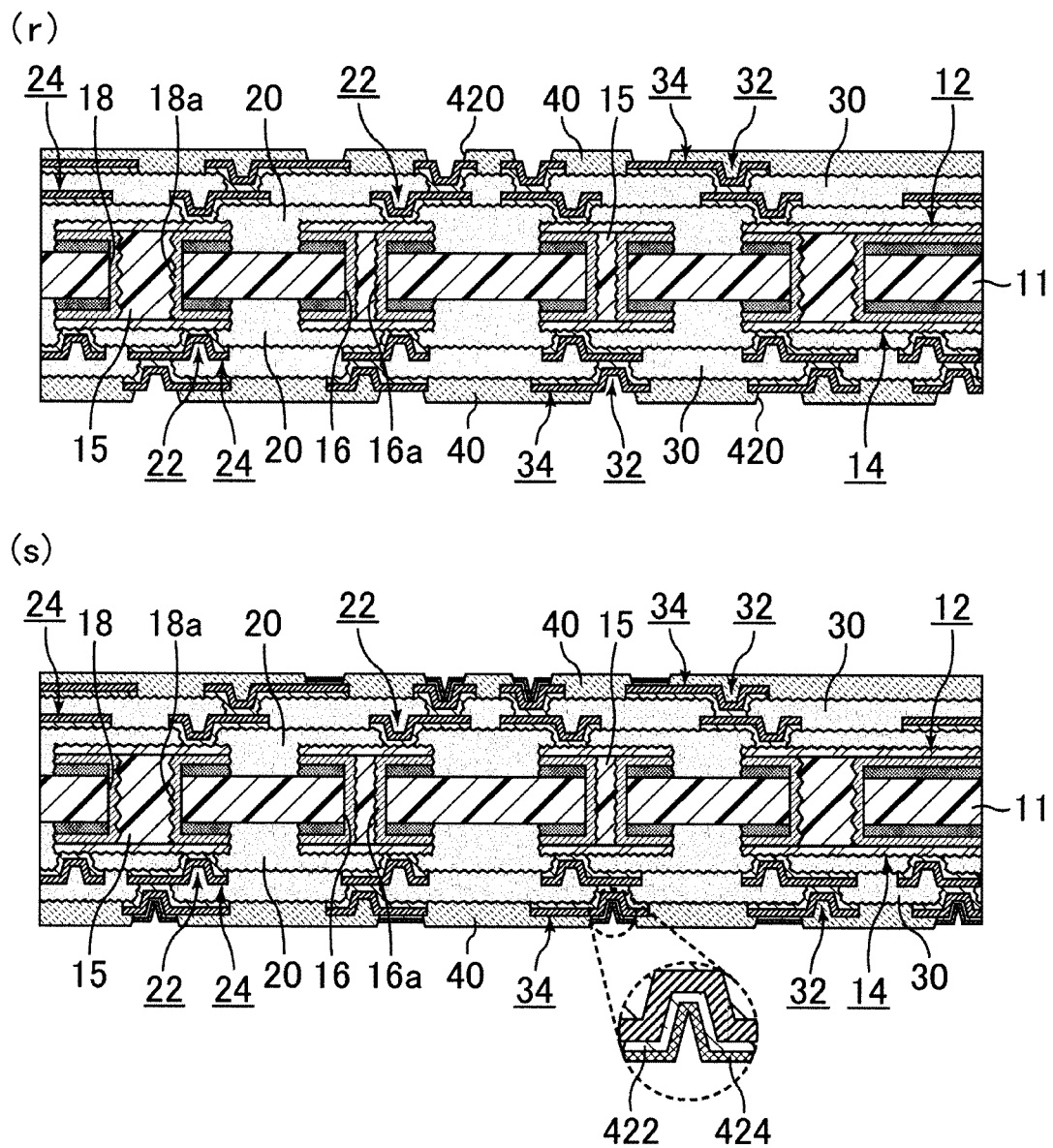
FIGS. 5(r)~(s) are cross-sectional views schematically showing each step in the method for manufacturing a printed wiring board according to the first embodiment of the present invention.

(17) Next, on both surfaces of the substrate where upper interlayer resin insulation layers 30 and conductive circuits 34 (including via conductors 32) are formed, solder-resist layers 40 having openings 420 are formed (see FIG. 5(r)), and Ni-plated layer 422 and gold-plated layer 424 are formed in openings 420 (see FIG. 5(s)).

(18) Then, solder balls are loaded in openings 420 of solder-resist layers 40 and a reflow is conducted to form solder bumps (46S, 46V, 46G, 66S, 66V, 66G). Printed wiring board 10 is completed (see FIG. 6).

(19) Lastly, IC chip 50 is mounted so that solder bumps (46S, 46V, 46G) of printed wiring board 10 respectively face pads (52S, 52V, 52G) and a reflow is conducted to install IC chip 50. Then, printed wiring board 10 is also positioned on motherboard 60 and mounted on motherboard 60 by conducting a reflow (see FIG. 7).

Following are the effects of a printed wiring board and a method for manufacturing a printed wiring board according to the first embodiment.

(1) In a printed wiring board according to the first embodiment of the present invention, first conductive circuits made of first conductor are formed on a first surface of a core substrate, and second conductive circuits made of second conductor are formed on a second surface of a core substrate. In addition, a first penetrating hole is formed in the central part of the core substrate and a second penetrating hole having a larger diameter than the first penetrating hole is formed in the peripheral part. On both sides of the first penetrating hole, a first through-hole conductor is formed to connect a first conductive circuit made of the first conductor and a second conductive circuit made of the second conductor. Also, on both sides of the second penetrating hole, a second through-hole conductor is formed to connect a first conductive circuit and a second conductive circuit. Arithmetic average roughness (Ra1) on the inner wall of the first through-hole conductor formed in the first penetrating hole is set lower than arithmetic average roughness (Ra2) on the inner wall of the second through-hole conductor formed in the second penetrating hole.

Accordingly, when printing is conducted at a speed to be used for filling a larger penetrating hole, namely, even when printing is conducted at a relatively high speed, the resistance greatly decreases while the first penetrating hole is being filled with filling material, and a sufficient amount of filling material is filled in the first penetrating hole. As a result, both the first penetrating hole and the second penetrating hole are sufficiently filled with filling material without causing a void, and the flatness of their surfaces is secured.

(2) In a printed wiring board according to the first embodiment of the present invention, filling material containing resin and inorganic filler is filled in the first penetrating hole and the second penetrating hole. Therefore, the thermal expansion of the filling material is greatly suppressed and it is easier to secure connection reliability in through-hole conductors.

(3) In a printed wiring board according to the first embodiment of the present invention, arithmetic average roughness (Ra1) on the inner wall of the first penetrating hole is set at 0.1 μm or greater and 0.2 μm or lower. If arithmetic average roughness (Ra1) on the inner wall of the first penetrating hole exceeds 0.2 μm, problems tend to occur such as difficulty in filling resin in the first penetrating hole during high-speed printing. However, since arithmetic average roughness (Ra1) on the inner wall of the first penetrating hole is 0.2 μm or lower, it is easier for filling material to enter the first penetrating hole, and the filling material is also sufficiently filled in the first penetrating hole. In addition, if arithmetic average roughness (Ra1) on the inner wall of the first penetrating hole is lower than 0.1 μm, the degree of roughening of the inner wall is low. Thus, filling material tends to flow out of the first penetrating hole while filling material is being filled. However, arithmetic average roughness (Ra1) on the inner wall of the first penetrating hole is set at 0.1 μm or greater in a printed wiring board according to the first embodiment of the present invention. Therefore, filling material seldom flows out of the first penetrating hole, and filling material is sufficiently filled in the first penetrating hole.

(4) In a printed wiring board according to the first embodiment of the present invention, the diameter of the first penetrating hole is set at 180 μm or smaller. When the diameter of a penetrating hole is 180 μm or smaller, filling material tends not to stay in the first penetrating hole during high-speed printing, and the inside of the first penetrating hole may not be filled sufficiently. However, since arithmetic average roughness (Ra1) on the inner wall of the first penetrating hole is lower than arithmetic average roughness (Ra2) on the inner wall of the second penetrating hole, filling material is sufficiently filled in the first penetrating hole as well.

(5) In a printed wiring board according to the first embodiment of the present invention, the first through-hole conductor is used for a power-source line, and the second through-hole conductor is used for a signal line. The first through-hole conductor, which is in the first penetrating hole with a smaller diameter than that of the second penetrating hole, is used for a power-source line. Therefore, multiple power-source lines are arranged in a printed wiring board, high-frequency properties of power-source lines are improved, and malfunctioning of semiconductor devices or the like to be mounted on the printed wiring board is prevented.

(6) In a printed wiring board according to the first embodiment of the present invention, since the first through-hole conductor is formed directly under a semiconductor element, the length of a power-source conductor is reduced in the printed wiring board. Therefore, power is supplied to the semiconductor element instantaneously without loss.

(7) In a method for manufacturing a printed wiring board according to the first embodiment of the present invention, a core substrate is prepared, a drill is used to bore a first penetrating hole in the central part of the core substrate, and then in the peripheral part of the core substrate, second penetrating hole 18 having a larger diameter than the first penetrating hole is bored using a drill with a larger diameter than that used for boring the first penetrating hole. Next, a first conductor is formed on a first surface of the core substrate and a second conductor is formed on a second surface. A first through-hole conductor is formed in the first penetrating hole to connect the first conductor and the second conductor, and a second through-hole conductor is formed in the second penetrating hole to connect the first conductor and the second conductor. Next, arithmetic average roughness (Ra1) on the inner wall of the first penetrating hole is set lower than arithmetic average roughness (Ra2) on the inner wall of the second penetrating hole.

Accordingly, when printing is conducted at a speed to be used for filling a larger penetrating hole, namely, even when printing is conducted at a relatively high speed, the resistance greatly decreases while the first penetrating hole is being filled with filling material, and a sufficient amount of filling material is filled in the first penetrating hole. As a result, both the first penetrating hole and the second penetrating hole are sufficiently filled with filling material without causing a void, and the flatness of their surfaces is secured.

(8) In a method for manufacturing a printed wiring board according to the first embodiment of the present invention, since a drill is used to form the first penetrating hole and the second penetrating hole, a penetrating hole with a predetermined diameter is securely formed.

(9) In a method for manufacturing a printed wiring board according to the first embodiment of the present invention, filling material containing resin and inorganic filler is simultaneously filled in the first penetrating hole and the second penetrating hole in a vacuum atmosphere. During that time, arithmetic average roughness (Ra1) on the inner wall of the first penetrating hole is set lower than arithmetic average roughness (Ra2) on the inner wall of the second penetrating hole in a method for manufacturing a printed wiring board according to the first embodiment of the present invention. Therefore, when filling material containing resin and inorganic filler is simultaneously filled in the first penetrating hole and the second penetrating hole which are formed in the core substrate, a sufficient amount of filling material is filled, and a filling material layer is formed.

Other Embodiment(s)

Figure 8:
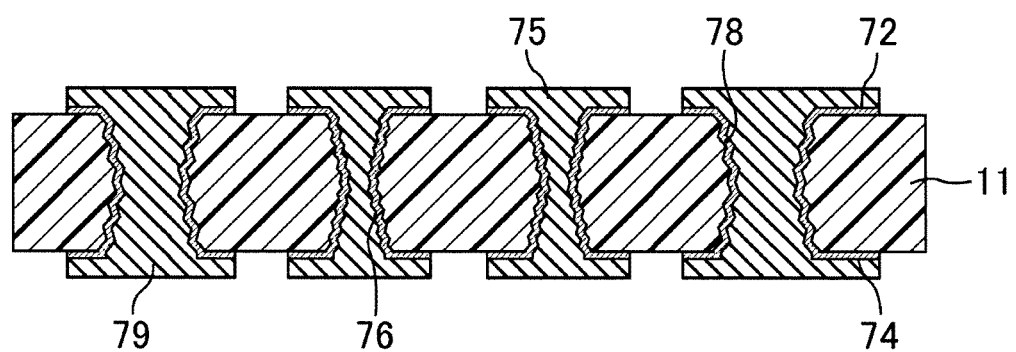
FIG. 8 is a cross-sectional view schematically showing a core substrate where first and second penetrating holes are formed by irradiating a laser at the core substrate.

FIG. 8 is a cross-sectional view schematically showing a core substrate in which a first penetrating hole and a second penetrating hole are formed by irradiating a laser at the core substrate. By irradiating a laser respectively from both surfaces of core substrate 11, first penetrating hole 76 and second penetrating hole 78 are formed. Then, inner walls of first penetrating hole 76 and second penetrating hole 78 are roughened the same as in the first embodiment so that arithmetic average roughness (Ra1) of first penetrating hole 76 is set lower than arithmetic average roughness (Ra2) of second penetrating hole 78. Then, plating is filled in first penetrating hole 76 and second penetrating hole 78 to form first through-hole conductor 75 and second through-hole conductor 79. During that time, since the roughness of first penetrating hole 76 with a smaller diameter is relatively low, the filling performance of the plating is enhanced, and a void is suppressed from occurring in first through-hole conductor 75.

As for solder-resist compositions, for example, the following are listed: polyphenylene ether resin, polyolefin resin, fluororesin, thermoplastic elastomer, epoxy resin, polyimide resin and the like.

In addition, as solder-resist compositions other than the above, for example, the following are listed: novolac epoxy resin (meth)acrylate, imidazole curing agents, bifunctional (meth)acrylic ester monomer, (meth)acrylate polymers with an approximate molecular weight of 500~5,000, thermosetting resins made of bisphenol-type epoxy resin or the like, photosensitive monomers such as polyvalent acrylic monomers, and paste-like fluids containing glycol ether solvents. Also, when forming a layer of a solder-resist composition, a film made from the above solder-resist compositions may be pressurized to form a layer of solder-resist composition.

In the above-described embodiment, Ni-plated layer 422 and gold-plated layer 424 are formed in openings 420. However, the total number of the above cover layers is not limited to two, and it may be one or three or more. In addition, by plating Ni, Pd and Au in that order in openings 420, multiple plated layers may also be formed.

Also, when a laser is used to form opening portions in the above lower interlayer resin insulation layer, upper interlayer resin insulation layer and solder-resist layer, a carbon-dioxide gas laser, ultra-violet laser, excimer laser or the like is used as the laser for such laser processing.

A printed wiring board according to an embodiment of the present invention has the following: a core substrate with a first surface and a second surface opposite the first surface, and having a first penetrating hole and a second penetrating hole with a diameter larger than that of the first penetrating hole; a first conductor formed on the first surface of the core substrate; a second conductor formed on the second surface of the core substrate; a first through-hole conductor formed in the first penetrating hole and connecting the first conductor and the second conductor; and a second through-hole conductor formed in the second penetrating hole and connecting the first conductor and the second conductor. In such a wiring board, the inner wall of the first penetrating hole and the inner wall of the second penetrating hole are roughened, and arithmetic average roughness (Ra1) on the inner wall of the first penetrating hole is set lower than arithmetic average roughness (Ra2) on the inner wall of the second penetrating hole.

When resin is filled in a penetrating hole, if the printing speed is increased, a sufficient amount of resin is filled without causing a void in a penetrating hole with a larger diameter, while it is difficult to fill a sufficient amount of resin in a penetrating hole with a smaller diameter. On the other hand, if the printing speed is decreased, a sufficient amount of resin is filled in a penetrating hole with a smaller diameter, while a void tends to occur in a penetrating hole with a larger diameter. Since high-speed printing is preferable from the viewpoint of manufacturing efficiency, it is preferred to fill resin in all penetrating holes by high-speed printing. However, such printing may cause difficulty in filling resin sufficiently in a penetrating hole with a smaller diameter, as described above.

In a printed wiring board according to an embodiment of the present invention, arithmetic average roughness (Ra1) on the inner wall of a second penetrating hole, which has a relatively large diameter compared with a first penetrating hole, is relatively great compared with that on the inner wall of the first penetrating hole. Accordingly, when printing is conducted at a speed used for filling resin material in a larger penetrating hole, namely, even when printing is conducted at a relatively high speed, resistance is slight while filling material is being filled, because arithmetic average roughness (Ra1) on the inner wall of a first penetrating hole is set lower than arithmetic average roughness (Ra2) on the inner wall of a second penetrating hole. Therefore, it is easier for filling material to be filled in the first penetrating hole. As a result, a sufficient amount of filling material is filled in first and second penetrating holes formed in the core substrate.

In the printed wiring board described above, filling material containing resin and inorganic filler may be filled in the above first penetrating hole and the second penetrating hole. Due to the inorganic filler contained, the thermal expansion coefficient of the filling material is reduced. As a result, the reliability of through-hole conductors is secured.

In the printed wiring board, arithmetic average roughness (Ra1) on the inner wall of the first penetrating hole may be set at 0.2 μm or lower. If arithmetic average roughness (Ra1) on the inner wall of the first penetrating hole exceeds 0.2 μM, problems may occur such as difficulty in filling resin in the first penetrating hole by high-speed printing. However, in the printed wiring board above, arithmetic average roughness (Ra1) on the inner wall of the first penetrating hole is set at 0.2 μm or lower. Therefore, it is easier for filling material to enter the first penetrating hole, and filling material is sufficiently filled in the first penetrating hole.

In the printed wiring board, arithmetic average roughness (Ra1) on the inner wall of the first penetrating hole may be set at 0.1 μm or greater and 0.2 μm or lower. Since arithmetic average roughness (Ra1) on the inner wall of the first penetrating hole is 0.1 μm or greater, adhesiveness is secured between the filling material and the through-hole conductor.

In the printed wiring board, the diameter of the first penetrating hole may be 180 μm or smaller. When the diameter of a penetrating hole is 180 μm or smaller, filling material tends not to stay in the first penetrating hole during high-speed printing, and it may be difficult to fill the filling material. However, since arithmetic average roughness (Ra1) on the inner wall of the first penetrating hole is set lower than arithmetic average roughness (Ra2) on the inner wall of the second penetrating hole in the above printed wiring board, filling material is also sufficiently filled in the above first penetrating hole.

In the printed wiring board, the first through-hole conductor may form a power-source line and the second through-hole conductor may form a signal line. The first through-hole conductor in a first penetrating hole having a smaller diameter than a second penetrating hole is used for a power-source line. Therefore, multiple power-source lines are arranged in a printed wiring board, resulting in smooth power supply to a semiconductor element. Accordingly, a semiconductor element can be operated instantaneously.

In the printed wiring board, since the first through-hole conductor may be formed directly under a semiconductor element, the length of a power-source conductor in the printed wiring board is reduced. Thus, power is supplied to the semiconductor element without loss, and malfunctioning of the semiconductor element is effectively suppressed.

A method for manufacturing a printed wiring board according to another embodiment of the present invention includes the following: preparing a core substrate having a first surface and a second surface opposite the first surface; forming a first penetrating hole in the core substrate; in the core substrate, forming a second penetrating hole having a larger diameter than the first penetrating hole; forming a first conductor on the first surface of the core substrate; forming a second conductor on the second surface of the core substrate; in the first penetrating hole, forming a first through-hole conductor connecting the first conductor and the second conductor; in the second penetrating hole, forming a second through-hole conductor connecting the first conductor and the second conductor; and roughening inner walls of the first penetrating hole and the second penetrating hole. In such a method, arithmetic average roughness (Ra1) on the inner wall of the first penetrating hole is set lower than arithmetic average roughness (Ra2) on the inner wall of the second penetrating hole.

In the method for manufacturing a printed wiring board, arithmetic average roughness (Ra1) on the inner wall of the first penetrating hole formed in the core substrate of the printed wiring board may be set lower than arithmetic average roughness (Ra2) on the inner wall of the second penetrating hole. Therefore, when printing is conducted at a speed used for filling a larger penetrating hole, namely, even when printing is conducted at a relatively high speed, since arithmetic average roughness (Ra1) on the inner wall of a first penetrating hole is set lower than arithmetic average roughness (Ra2) on the inner wall of a second penetrating hole, it is easier for filling material to be filled in the first penetrating hole. Accordingly, a sufficient amount of filling material is filled in the first and second penetrating holes formed in the core substrate.

Here, as for a method for setting arithmetic average roughness (Ra1) on the inner wall of a first penetrating hole to be lower than arithmetic average roughness (Ra2) on the inner wall of a second penetrating hole, the following method is listed: surfaces of a first penetrating hole and a second penetrating hole in a core substrate are roughened to have different degrees of roughness before forming a first through-hole conductor and a second through-hole conductor; and a first through-hole conductor and a second through-hole conductor are formed on those surfaces so that surfaces of the first through-hole conductor and the second through-hole conductor are roughened according to the roughness of the core substrate. As a method for forming roughened surfaces in the first and second penetrating holes at different degrees of roughness, the number of roughening treatments may be changed for the first penetrating hole and the second penetrating hole. Since deeper roughened surfaces are usually formed by increasing the number of roughening treatments, a greater number of roughening treatments are performed on the second penetrating hole.

Also, it is an option to perform roughening treatments on first and second through-hole conductors to roughen the surfaces of first and second through-hole conductors at different degrees of roughness. As a method for forming roughened surfaces on the surfaces of first and second through-hole conductors at different degrees of roughness, the number of roughening treatments may be changed for the first and second through-hole conductors.

In the method for manufacturing a printed wiring board, since a drill may be used to form the first and second penetrating holes, penetrating holes with predetermined diameters are securely formed.

In the method for manufacturing a printed wiring board, filling material containing resin and inorganic filler may be filled in a vacuum atmosphere in first and second penetrating holes. In addition, arithmetic average roughness (Ra1) on the inner wall of the first penetrating hole is set lower than arithmetic average roughness (Ra2) on the inner wall of the second penetrating hole. Therefore, a sufficient amount of filling material is filled in the first and second penetrating holes formed in the core substrate.

In the method for manufacturing a printed wiring board, the filling material may be filled in the first penetrating hole at the same time as the filling material is filled in the second penetrating hole. However, by appropriately setting the viscosity or the like of the filling material, a sufficient amount of filling material is filled in the first and second penetrating holes.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a core substrate having a first surface and a second surface on an opposite side of the first surface of the core substrate;
a first conductor formed on the first surface of the core substrate;
a second conductor formed on the second surface of the core substrate;
a first through-hole conductor formed through the core substrate and connecting the first conductor and the second conductor; and
a second through-hole conductor formed through the core substrate and connecting the first conductor and the second conductor
a plurality of first cover layers formed on end portions of the first through-hole conductor respectively such that the first cover layers are covering openings of the end portions of the first through-hole conductor respectively; and
a plurality of second cover layers formed on end portions of the second through-hole conductor respectively such that the second cover layers are covering openings of the end portions of the second through-hole conductor respectively,
wherein the second through-hole conductor has a diameter which is greater than a diameter of the first through-hole conductor, the first through-hole conductor has a roughened inner wall forming an interior space, the second through-hole conductor has a roughened inner wall forming an interior space, the roughened inner wall of the first through-hole conductor has an arithmetic average roughness which is set lower than an arithmetic average roughness of the roughened inner wall of the second through-hole conductor, wherein the arithmetic average roughness of the roughened inner wall of the first through-hole conductor is set at 0.1 µm or greater and 0.2 µm or lower and wherein the arithmetic average roughness of the roughened inner wall of the second through-hole conductor is set in a range of more than 0.2 µm to 0.3 µm or lower and the interior space of the first through-hole conductor and the interior space of the second through-hole conductor are filled with a filling material comprising a resin and an inorganic filler.

2. The printed wiring board according to claim 1, wherein the filling material includes a leveling agent, and the inorganic filler has an amount in a range of 3 to 50 weight percent in the filling material.

3. The printed wiring board according to claim 1, wherein the diameter of the first through-hole conductor is set at 180 µm or smaller.

4. The printed wiring board according to claim 1, wherein the first through-hole conductor forms a power-source line, and the second through-hole conductor forms a signal line.

5. The printed wiring board according to claim 4, wherein the first through-hole conductor is positioned directly under a semiconductor element mounted on a surface of the printed wiring board.

6. The printed wiring board according to claim 1, wherein the core substrate has a first penetrating hole in which the first through-hole conductor is formed and a second penetrating hole in which the second through-hole conductor is formed, the second penetrating hole has a diameter which is greater than a diameter of the first penetrating hole, the first penetrating hole has a roughened inner wall on which the first through-hole conductor comprising a plated film is formed, the second penetrating hole has a roughened inner wall on which the second through-hole conductor comprising a plated film is formed, and the roughened inner wall of the first penetrating hole has an arithmetic average roughness which is set lower than an arithmetic average roughness of the roughened inner wall of the second penetrating hole.

7. A primed wiring board, comprising:
a core substrate;
a first conductor formed on a first surface of the core substrate;
a second conductor formed on a second surface of the core substrate on an opposite side of the first surface of the core substrate;
a first through-hole conductor formed through the core substrate and connecting the first conductor and the second conductor;
a second through-hole conductor formed through the core substrate and connecting the first conductor and the second conductor,
wherein the core substrate has a first penetrating hole in which the first through-hole conductor is formed and a second penetrating hole in which the second through-hole conductor is formed, the second penetrating hole has a diameter which is greater than a diameter of the first penetrating hole, the first penetrating hole has a roughened inner wall on which the first through-hole conductor comprising a plated film is formed, the second penetrating hole has a roughened inner wall on which the second through-hole conductor comprising a plated film is formed, and the roughened inner wall of the first penetrating hole has an arithmetic average roughness which is set lower than an arithmetic average roughness of the roughened inner wall of the second penetrating hole wherein the arithmetic average roughness of the roughened inner wall of the first through-hole conductor is set at 0.1 µm or greater and 0.2 µm or lower and the arithmetic average roughness of the roughened inner wall of the second through-hole conductor is set in a range of more than 0.2 µm to 0.3 µm or lower.

8. The printed wiring board according to claim 7, wherein the first through-hole conductor has a roughened inner wall forming an interior space, the second through-hole conductor has a roughened inner wall forming an interior space, the roughened inner wall of the first through-hole conductor has an arithmetic average roughness which is set lower than an arithmetic average roughness of the roughened inner wall of the second through-hole conductor, and the interior spaces of the first and second through-hole conductors are filled with plating.

9. The printed wiring board according to claim 7, wherein the diameter of the first through-hole conductor is set at 180 μm or smaller.

10. The printed wiring board according to claim 7, wherein the first through-hole conductor forms a power-source line, and the second through-hole conductor forms a signal line.

11. The printed wiring board according to claim 10, wherein the first through-hole conductor is positioned directly under a semiconductor element mounted on a surface of the printed wiring board.

12. The printed wiring board according to claim 7, wherein the diameter of the first through-hole conductor is set at 180 μm or smaller.

* * * * *